US008531045B2

(12) United States Patent
Kärkkäinen

(10) Patent No.: US 8,531,045 B2
(45) Date of Patent: Sep. 10, 2013

(54) COMPONENT PACKAGING AND ASSEMBLY

(75) Inventor: Ari Kärkkäinen, Oulu (FI)

(73) Assignee: Optitune Public Limited Company, London (GB)

( * ) Notice: Subject to any disclaimer, the term of this patent is extended or adjusted under 35 U.S.C. 154(b) by 759 days.

(21) Appl. No.: 10/528,388

(22) PCT Filed: Sep. 19, 2003

(86) PCT No.: PCT/GB03/04129
§ 371 (c)(1), (2), (4) Date: Mar. 18, 2005

(87) PCT Pub. No.: WO2004/027862
PCT Pub. Date: Apr. 1, 2004

(65) Prior Publication Data
US 2006/0151859 A1     Jul. 13, 2006

(30) Foreign Application Priority Data
Sep. 19, 2002    (EP) .................................. 02256515

(51) Int. Cl.
*H01L 23/29*    (2006.01)

(52) U.S. Cl.
USPC .............. 257/794; 257/99; 257/788; 257/790

(58) Field of Classification Search
USPC .................... 257/98–100, 678–733, 787–796
See application file for complete search history.

(56) References Cited

U.S. PATENT DOCUMENTS

| 4,696,851 A | 9/1987 | Pryor | |
|---|---|---|---|
| 5,478,778 A | 12/1995 | Tanisawa | |
| 5,909,524 A * | 6/1999 | Tabuchi | 385/49 |
| 6,022,760 A * | 2/2000 | Lebby et al. | 438/123 |
| 6,144,795 A | 11/2000 | Dawes et al. | |
| 6,177,728 B1 | 1/2001 | Susko et al. | |
| 6,429,045 B1 * | 8/2002 | Furukawa et al. | 438/107 |
| 6,436,613 B1 * | 8/2002 | Fallahi et al. | 430/321 |
| 2001/0014429 A1 | 8/2001 | Iha | |
| 2003/0048074 A1 * | 3/2003 | Ni et al. | 313/512 |

FOREIGN PATENT DOCUMENTS

JP    10-150033    6/1998

OTHER PUBLICATIONS

PCT International Search Report.

* cited by examiner

*Primary Examiner* — Matthew W Such
*Assistant Examiner* — Abul Kalam
(74) *Attorney, Agent, or Firm* — Nixon & Vanderhye PC

(57) ABSTRACT

A packaging layer (200) for a wafer level assembly is fabricated from a glass material comprising both inorganic and organic components. This allows matching between the coefficient of thermal expansion of the packaging layer and that of other materials in the wafer assembly, particularly electrical interconnect materials. It is also possible to introduce properties to support such methods as photolithographic and low temperature processing of the packaging layer. This can improve fabrication accuracy and allows the packaging layer to be used with structures in a wafer assembly which might be damaged by high temperature processing, such as active optoelectronic devices and integrated circuits. Another major advantage is that the glass material can be used to provide optical characteristics as well as mechanical protection. The refractive index and other optical properties can be preselected and thus the glass material can be used for instance for waveguiding and index matching.

37 Claims, 9 Drawing Sheets

COMPONENT PACKAGING AND ASSEMBLY

This application is the US national phase of international application PCT/GB2003/004129 filed 19 Sep. 2003 which designated the U.S. and claims benefit of EP 02256515.4, dated 19 Sep. 2002, the entire content of which is hereby incorporated by reference.

BACKGROUND

1. Technical Field

The present invention relates to component packaging and finds particular application in wafer-level packaging of, for example, electrical and/or optical components such as lasers and associated devices.

2. Related Art

Component packaging is used in semiconductor-based technologies generally to protect or support a component or an assembly of components for handling or further processing. Packaging can potentially be done at different levels, from individual items up to finished assemblies. For instance, a sub-assembly of components can be packaged together so that a function of the sub-assembly can be tested without waiting for the finished equipment.

Various types of protection can be offered by packaging, including mechanical and chemical. For example, a passivation layer can be used to provide environmental protection for any active and passive components integrated on a substrate. Such a passivation layer can be provided during an assembly process, as an intermediate layer of a wafer level assembly, or deposited as a final step in wafer level processing. In another example, a planarisation layer can be used to improve a surface for subsequent layers or devices. Planarisation layers are used for example to smooth the surface of a substrate which is otherwise uneven, such as ceramic and composite surfaces such as alumina and LTCC substrates or plastics. Unpolished substrate surfaces can be planarised to achieve good surface quality and surfaces already carrying other structures, such as interconnect material, can be smoothed over by a planarisation layer to present a flat surface in spite of the presence of the structures.

Wafer level packaging is becoming known as an attractive method of packaging low to mid density devices for several reasons: cost, size and ease of testing.

Cost is the largest force driving wafer-level packaging. Using simultaneous batch integration processing, an entire wafer or substrate can be packaged instead of packaging each device. Wafer level packaging reduces the number of steps involved in packaging, potentially eliminates the use of underfill and allows for centralized processing during fabrication. Further, packaging of the wafer allows for a high degree of process integration, due to the use of technologies such as thin film and lithography, which decreases cost. Centralized packaging during fabrication also reduces packaging time and inventory, since devices are no longer packaged separately prior to assembly.

Device size is also a driving force for wafer-level packaging. The size of a wafer level packaged device can be much the same as packaged semiconductor chips.

From the testing point of view, wafer-level packaging has a major advantage. Testing at the wafer-level (which is intermediate testing of the device functionality to decide which particular devices are going to be finally packaged and used as an end product) can reduce test costs by as much as 50%, requiring both less capital and reducing the number of test steps.

However, known wafer-level packaging is not suitable for use in the fabrication, assembly and packaging of all components and devices. For example, it is not used for active optical devices and components such as tunable and/or external cavity lasers.

Conventional approaches for wafer level integration and the fabrication of "build-up layers" on an integration substrate are based on the deposition and patterning of organic materials such as Dow Chemical's SilK, or the chemical vapour deposition (CVD) of metal oxide type coatings.

A known problem of purely organic materials is that their co-efficient of thermal expansion (CTE) is high compared to that of materials such as metals and semiconductors used in substrate-based integration for example for interconnects and other aspects of optoelectronic operations. A typical CTE of organic materials is 60 ppm (parts per million per ° C.) or higher. A significant mismatch in CTE between a layer and material it is in contact with tends to cause stresses at the interface. In addition, organic materials lack thermal stability, which may limit a device's long-term stability and exclude some manufacturing techniques such as soldering and metallization.

On the other hand, CVD is a high temperature process, which limits the selection of substrate materials and the type of electronic or optoelectronic devices which can be assembled to the substrate before CVD inorganic film deposition. Furthermore, the processing of openings (assembly holes) is time consuming and deep structures are relatively complicated to fabricate.

BRIEF SUMMARY

According to a first aspect of the present invention, there is provided a substrate-based assembly for carrying optical and/or electrical components, the substrate-based assembly comprising at least one packaging layer, wherein the packaging layer(s) comprises a glass material having both organic and inorganic components.

The "substrate-based assembly" may comprise a wafer assembly in which at least one device or component is to be supported on a wafer of material as substrate. A "substrate-based assembly" might already have a device or component mounted thereon but the phrase encompasses a substrate plus packaging layer prior to, or in the absence of, mounting of any device or component.

A "glass material" in this context is used in the usual way to mean an amorphous or non-crystalline solid. References elsewhere in this description to a "hybrid glass material" and the like are intended to refer to a glass material having both inorganic and organic components.

In an embodiment of the present invention, because of its organic/inorganic nature, it is possible to select a glass material for the packaging layer which has one or more particular properties or functions. These may be mechanical. For example, the adjustment of the organic/inorganic ratio makes it possible to tune the values for one or more of: CTE; hardness; stress modulus (known as substrate bow); and thermal stability.

For example, if the concentration of inorganic materials is increased:
 the CTE decreases
 the hardness increases
 the stress modulus increases
 thermal stability typically increases.
If the concentration of organic materials is increased:
 the material softens and becomes more elastic
 the CTE increases
 the thermal stability decreases.

The CTE of suitable organic materials is typically 50 ppm or more and the CTE of inorganic materials (e.g. glass, silica, alumina etc.) is typically just a few ppm or less. Hence it is available to tune the CTE over a significant range by adjusting the inorganic/organic ratio in the material. For example, the CTE is 100 ppm or more in materials having an epoxy concentration of about 70% or more while alumina has a CTE of 6.7 ppm and silica has a CTE of 0.5 ppm.

A substrate-based assembly according to the first aspect of the present invention may further comprise electrical interconnect material.

It will usually be preferable that the value of the CTE for the hybrid glass material used as a packaging layer approaches that of the electrical interconnect material. For example, suitable interconnect materials that might be used are copper and aluminium, in which case the closer the CTE of the hybrid glass material is to the values for copper and aluminium the better. In general, it is preferable that the CTE of the hybrid glass material should not differ more than 15 ppm from the CTE of the interconnect material.

It may also or instead be preferred that the value of the CTE for the hybrid glass material used as a packaging layer approaches that of the substrate material. For example, it might be preferred that the CTE of the hybrid glass material should not differ more than 15 or 20 ppm from the CTE of the substrate material.

The electrical interconnect material might be present for example as structures such as contact pads for bump bonding or for wire bonding. A sub-assembly comprising an embodiment of the present invention may be used as an integration level for bump bonding in which a bump of conductive material is positioned on a pad of interconnect material, or indeed double bump bonding where a double layer of solders (bumps) is created on top of interconnect material that has been provided in the sub-assembly.

Concentration levels of inorganic and organic material components can be varied considerably in the glass material, providing a potential range of CTE values for example from 3 to 100 ppm. In the glass material, an inorganic matrix can be provided at least in part by any metal alkoxide or salt that can be hydrolysed, all of these being appropriate inorganic network formers, including those based on groups 3A, 3B, 4B and 5B of the Periodic Table, such as silicon dioxide, aluminium oxide, titanium dioxide and zirconium oxide.

Functional organic moieties can then be used to modify the inorganic matrix. In general, the glass material of the substrate-based assembly will preferably include an organic component which polymerises by cross-linking. It might for instance be an organic component which polymerises under thermal or photo treatment, such as the functional hydrocarbon compounds comprising acrylates, epoxides, alkyls, alkenes, or aromatic groups which support photopolymerisation.

The hybrid glass material of the packaging layer in a substrate-based assembly according to the first aspect of the present invention may advantageously have lithographic properties. The combination of organic and inorganic properties allows direct photolithographic patterning of the glass material. Thus it can be possible to select materials in embodiments of the present invention such that all fabricated structures can be produced by lithographic processing. This enables accurate positioning (sub micrometer accuracy) of components such as optical sub-assembly elements. Electrical interconnects can be created either before or after deposition of the hybrid glass material and the components can be mounted after the patterning of the hybrid glass material.

For example, the packaging layer of a substrate-based assembly according to the first aspect of the present invention might be provided with recesses during patterning, either as depressions or holes, in relation to which one or more components can subsequently be mounted.

All the inorganic and organic material components mentioned above are very favourable in terms of their properties and their tunability for wafer-scale integration.

By selection of appropriate components, it is possible to use low temperature processing of a hybrid glass material, for instance at less than 450° C. or even less than 200° C. or even 150° C. This makes it possible to integrate the glass onto existing electronic components and circuitry. In particular, if high processing temperatures are required the organic component content should be kept to a minimum. Low processing temperatures are made possible by using thermal- or photo-initiators resulting in polymerization of the organic matrix. The polymerisation may be achieved through organic carbon-carbon double bond openings and crosslinking. Known thermal initiators include benzophenone and various peroxides, such as benzoylperoxide and layroyl peroxide. Known photoinitiators include phenyl bis(2,4,6-trimethylbenzoyl)phosphine oxide (Irgacure 819) and 1-hydroxy-cyclohexyl-phenyl-ketone (Irgacure 814). (Irgacure initiators are products of Ciba Specialty Chemicals Inc. and "Irgacure" is a registered trade mark.)

In a novel arrangement, one or more components may be mounted in the substrate-based assembly for electrical interconnection using the known technique of "solder bump bonding". Standard solders such as lead and tin alloys can be used. In this known technique, solder bumps are applied to a connection surface of the component, or to a support surface, the component is placed in contact via the bumps with the support surface and then heat is applied. The solder flows to provide a relatively intimate bond and good electrical performance in use. Solder bump bonding has been found to have a very significant advantage however in that the components can be accurately aligned by manipulation while the bonding material is soft. This can be done during a mounting operation or subsequently by applying heat to the bonding material.

As well as components or devices, the substrate may also or instead support control electronics such as laser drivers, thermo-elements, signal controllers, buried integrated circuits such as central processing units (CPUs) for embedded software, and their various interconnects. One substrate can carry one to several tens of sub-assembly structures.

Suitable substrates for use in embodiments of the present invention are silicon, glass, composite materials, ceramics including multi-layer ceramics such as alumina and low temperature-co-fired ceramics (LTTC), and even conventional printed circuit board.

The packaging layer might be supported directly or indirectly by the substrate. One potential use for a packaging layer comprising a hybrid glass material is as a passivation layer and this might be applied during, or as a final layer in, wafer processing.

Optoelectronic equipment comprising a substrate-based assembly according to an embodiment of the present invention is also encompassed as an embodiment of the present invention. For example, this might be an optical source such as a wavelength tunable optical source.

In the past, packaging layers have provided only a generally protective and/or supporting function in a wafer. They have not contributed to optical qualities such as confinement of radiation travelling in the wafer. A packaging layer in a substrate-based assembly according to an embodiment of the present invention may have optical characteristics, for instance allowing it to be used to transmit optical radiation in use of the assembly, thus allowing fuller integration of optical devices at wafer level.

In such arrangements, the optical properties of the material of the packaging layer will be important. In addition to the possibility of tuning the mechanical characteristics described above, it is also possible to tune the optical characteristics. Thus a packaging layer itself can be used to have an active optical function in addition to its assembly role. Optical properties such as refractive index, birefringence, dispersion and dn/dT-value (rate of change in refractive index against temperature) can be tuned by selecting a glass material with certain composition.

For example, components which can be used to select the above optical characteristics are discussed below:

The relationship dn/dT in the hybrid glass materials usually has a value ranging from $-10 \times 10^{-5}$ (1/° C.) to $40 \times 10^{-5}$ (1/° C.). This range can be potentially made wider by choosing the right material composition. Especially in some applications material dn/dT value of 0 (zero) or positive dn/dT values would be very attractive to use. Material dn/dT value can be adjusted based on the crosslinking density of organic-inorganic components in the material matrix.

Increasing crosslinking density in an organo-siloxane matrix decreases the intrinsic dn/dT value of the material. The materials crosslinking density in an organic-inorganic matrix can be raised using two different approaches. A first approach is to increase the molar concentration of tetra functional siloxanes in the matrix, for example by increasing the compositional concentration of precursors that are capable of forming four silicon-oxygen bridges to other silicon atoms. A second approach is to increase the amount of multi-functional organic moieties in the matrix and especially components that are able to undergo organic crosslinking through organic double bond polymerisation.

The intrinsic dn/dT value will be decreased in the siloxane polymer by:
  increasing the concentration of tetrafunctional siloxanes
  increasing the concentration of thermally or radiation crosslinkable organic moieties
  increasing the concentration of non-organic-moieties containing metal or metalloid components The intrinsic dn/dT value will be increased in the siloxane polymer by:
  increasing the concentration of bifunctional and monofunctional siloxanes
  increasing the concentration of non-crosslinkable organic moieties By selection of appropriate inorganic and organic components, it is possible to tune the refractive index of a hybrid glass material to have a desired value. When using silicon dioxide based inorganic components a typical achievable range for indices is 1.41-1.52 at 1550 nm wavelength range. However, if e.g. zirconium, titanium or germanium based components are introduced to the material higher (close to 1.7 at 1550 nm) refractive indices can be achieved. The low refractive indexes can be achieved by using fluorinated organic moieties in the hybrid glass material.

Although the hybrid glass materials are considered as amorphous and non-crystalline solids the material may exhibit birefringence with some compositions. Birefringence is relatively low compared to crystalline or semi-crystalline glasses and polymers. Typical birefringence values with siloxane polymer materials may be in the range of $1 \times 10^{-5}$-$8 \times 10^{-4}$ and have to be controlled chemically by selection of the right material components.

The materials absorption/transmission characteristics can be tuned so that a specific optical wavelength experiences minimal optical losses when propagating in the material. This characteristic (optical loss) is greatly affected by the material components used and by the synthesis and processing conditions. The hybrid glass materials are synthesized by using metal alkoxides or salts (such as tetra alkoxy silane or tetra chloro silane), organo functionalized metal alkoxides or salts and pure organic moieties as precursors. The alkoxides are hydrolyzed and subsequently condensed by using proper reaction conditions and catalysts to results in metal oxide matrix formation (e.g. Si—O—Si, Ti—O—Ti, Al—O—Al, Ge—O—Ge, Zr—O—Zr). It should be noted that some alkoxide groups can remain unreacted and adversely affect optical properties of the hybrid glass produced. It is preferable to avoid this situation and drive the condensation reaction fully to the end. The organic moieties can also be reacted during the material synthesis with other precursor molecules or they can stay in the material as monomeric or oligomeric species not bonded covalently to the inorganic matrix components (metal oxide matrix). The choice of the organo modified metal alkoxides and salts and the purely organic precursors will also greatly affect the optical properties of the final hybrid glass material. In some cases it might be preferable to use fluorinated organic moieties to achieve the required low level in optical losses. The lithographic processing of the synthesised hybrid glass material will also affect the optical properties of the material film or structure. For example, the baking and UV-exposure conditions will affect final optical properties of the materials.

The term "organo functionalised" is used above. This is intended to mean an organic (for example a methyl group or benzene ring) is attached to a metal atom (for example silicon). There may be an alkoxide there already, such as a methoxy group. Organo functionalized however is meant to mean that the organo function does not react away during the hydrolysis and condensation as the methoxy group does.

However, when fabricating for example waveguide structures, the dominating factors for optical losses in the waveguide structure will be: coupling loss, waveguide shape and surface roughness. The optical loss for the bulk material itself can be tuned to be below 0.5 dB/cm or 0.1 dB/cm or even 0.01 dB/cm depending of course on the specific wavelength(s) used.

Although the use of hybrid glass material gives significant freedom for tuning and optimization of the material's mechanical and optical properties, one has to be able to control all of these properties simultaneously. All the above parameters have to be taken into account in designing the material synthesis in order to achieve repeatable, consistent optical materials that lend themselves to further fabrication process optimization.

It may be preferred that more than one packaging layer is provided, each packaging layer comprising a glass material having both organic and inorganic components. Where the assembly is to be used to carry optical radiation, it may be preferred that two or more packaging layers have differing optical qualities. For example, if one packaging layer has a different refractive index from another packaging layer, this might be used to support confinement of the optical radiation as it travels through the assembly.

A packaging layer in an embodiment of the present invention might be used for planarisation of a substrate. Depending on the substrate material e.g., silicon, glass, plastics, composite materials, ceramics (alumina and low temperature-co-fired ceramics), printed circuit board materials (polyimide and FR-4), the substrate may have a surface roughness that significantly affects the following fabrication steps. Conventional methods such as polishing can be used to achieve good surface quality. However not all the substrate materials are suited for polishing and furthermore it is a time-consuming process step. In the case of composite materials, ceramics and plastics it might be necessary to smooth the substrate surface before optical/assembly structure deposition. A planarisation layer can be deposited on the substrate to smooth its surface. Planarisation better than 90%, 95% or even 99% (that is, thickness uniformity is better than for example 99%) can be achieved, resulting in a substantially uniform surface for subsequent processing steps.

A planarisation layer can also be used where a substrate has already been modified in some way, for instance by the addition of a structure. For instance, the substrate surface may carry electrical interconnect material structures or other structures. This modified surface can be coated with a packaging layer comprising a hybrid glass material. Again, planarisation better than 90%, 95% or even 99% can be achieved, resulting in a uniform surface for subsequent lithography or other steps.

Just as with other packaging layers, one or more planarisation layers may have optical characteristics for use in a particular device or wafer structure, and may be used for example to transmit or confine optical radiation in use of the device or structure.

Packaging layers according to embodiments of the present invention can be patterned in depth, for instance using masks with non-uniform optical density, such as in binary or grey scale lithography, and this can be particularly advantageous where one or more optical characteristics of the packaging layer is to be used. For example, one or more packaging layers can be used in achieving alignment between components and/or structures in a wafer or other assembly, for instance enabling appropriate waveguiding.

It is possible to construct a step change in the depth of a packaging layer according to an embodiment of the present invention. This can provide a very useful abutment surface for positioning a facet of an active optical device, such as a laser, in subsequent mounting of the device in an assembly.

Thus, using any of a variety of fabrication methods, such as binary and grey scale photomasks, positive and negative resist materials and appropriate etching processes, embodiments of the invention can provide a wide variety of both alignment and optical characteristics which are particularly useful in fabricating wafer-based assemblies, such as abutment surfaces and light guiding structures, including for example tapered waveguides, index matching fluids and bonding materials, and specialised coupling arrangements.

According to a second aspect of the present invention, there is provided a method of packaging a substrate-based assembly, which method comprises the step of providing a packaging layer comprising a glass material having both organic and inorganic components.

A method according to the second aspect of the present invention may optionally comprise the step of providing one or more electrical interconnect structures in or adjacent to the packaging layer.

Further, such a method may include the step of using bump bonding to bond a component to an electrical interconnect structure. This has the advantage that the method may further comprise final alignment of two or more components by manipulating at least one of the components while the bonding material is sufficiently soft to accommodate the manipulation. For instance, the method might comprise the steps of:

a) maintaining the temperature of the bump bonding material above a softening temperature for the material and micromanipulating the component in relation to the mounting pad; and b) lowering the temperature of the bump bonding material to below said softening temperature so as to achieve bump bonding.

A method according to the second aspect of the present invention may optionally comprise the step of lithographic processing of the packaging layer. Such lithographic processing might be used for example to provide depth adjustment, or to create one or more recesses or holes in the packaging layer for use in positioning one or more components of the substrate-based assembly. Advantageously, embodiments of the present invention will support a method of fabricating a substrate-based assembly which method comprises lithographic processing of each fabricated layer of the substrate-based assembly. This offers very accurate positioning of components.

Lithographic processing to provide depth adjustment might comprise for example the use of a lithography mask having non-uniform optical density.

An advantageous method of fabricating a substrate-based assembly comprises the steps of applying an electrical interconnect structure to a surface, applying a planarisation layer over the electrical interconnect structure and creating one or more apertures in the planarisation layer to give access to the electrical interconnect structure.

Further, a method according to the second aspect of the present invention may optionally comprise the step of using gray scale lithography to fabricate a groove of tapered cross section in a packaging layer for mounting a fibre for optical coupling with an optical component.

Embodiments of the present invention can provide a practicable wafer-level packaging technique for electrical and/or optical components. In particular, embodiments of the invention can provide a novel method to fabricate an optical sub assembly at wafer-level, followed by alignment, testing and chip-scale packaging of the sub assembly.

Embodiments of the present invention are useful in packaging active (i.e. gain providing) optical devices. As an example, an embodiment of the invention can be used to manufacture chip-scale packaged tunable laser components. However, embodiments of the invention are not limited to use in packaging optical components but can be applied in packaging various electrical and optoelectrical devices. Resulting devices can be very compact and free of electromagnetic interference (EMI) and vibrational problems. Ease of integration and testing reduces device cost dramatically due to reducing the required equipment capital as well as ease of testing and early failure detection. In addition, due to the compact size and fairly dense integration level, resulting devices are reliable and can be used for example in modulation as very fast optoelectrical devices.

BRIEF DESCRIPTION OF THE DRAWINGS

A process and assembly for wafer level packaging will now be described as an embodiment of the present invention, by way of example only, with reference to the accompanying figures in which:

FIG. 10 shows the same vertical cross section as that shown in FIG. 7 with the addition of a wire-bonded sub-assembly of components which the structure is intended to accommodate. Both

It should be noted that none of the figures is intended to be drawn to scale. The figures are schematic representations only.

DETAILED DESCRIPTION OF EXEMPLARY EMBODIMENTS

Figure 8:
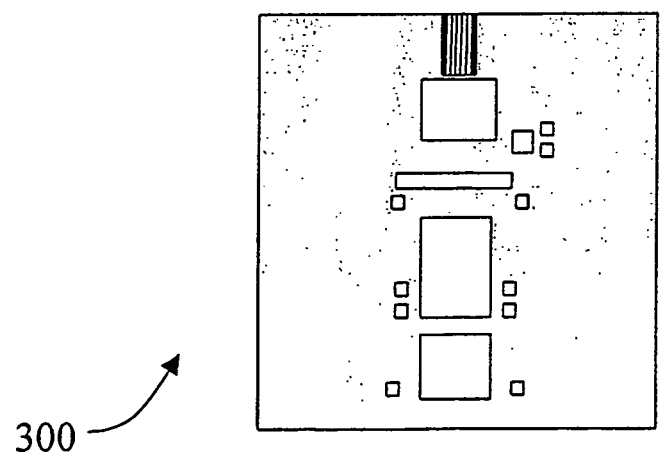
FIG. 8 shows a plan view, from above, of a first ("closed") version of the patterned structure of FIG. 5.
Figure 9:
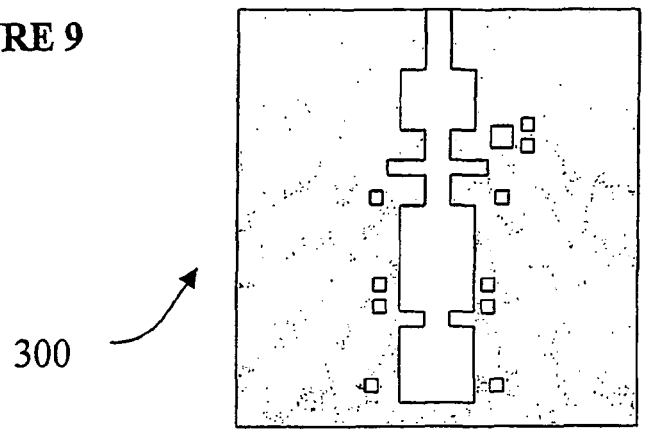
FIG. 9 shows a plan view, from above, of a second ("open") version of the patterned structure of FIG. 5.
Figure 10A:
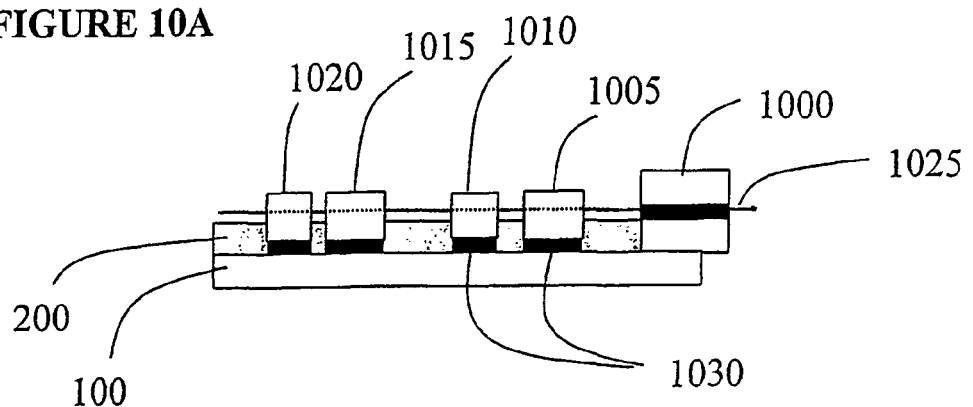
FIGS. 10A and 10B show a "closed" patterned structure, as shown in FIG. 8.
Figure 10B:
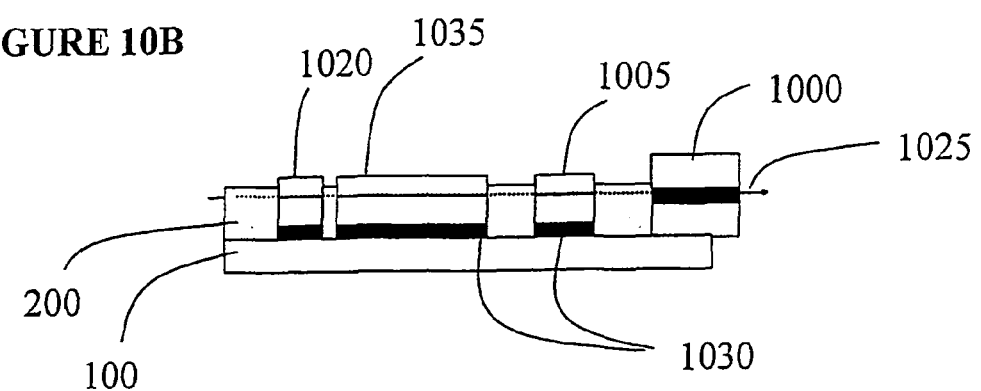

In general, FIGS. 1 to 11 and the description associated with them relate to a wafer based assembly in which a packaging layer primarily provides mechanical protection and positioning for wire-bonded components, although in the arrangement of FIG. 10B there is an optical requirement that the packaging layer is transparent in use. FIGS. 12 to 15 relate to a bump-bonded version of the assembly of FIGS. 1 to 11.

FIGS. 16 to 21 and the description associated with them relate to an assembly in which packaging layers provide mechanical protection, device alignment in the finished assembly and optical behaviour such as waveguiding.

Figure 1:
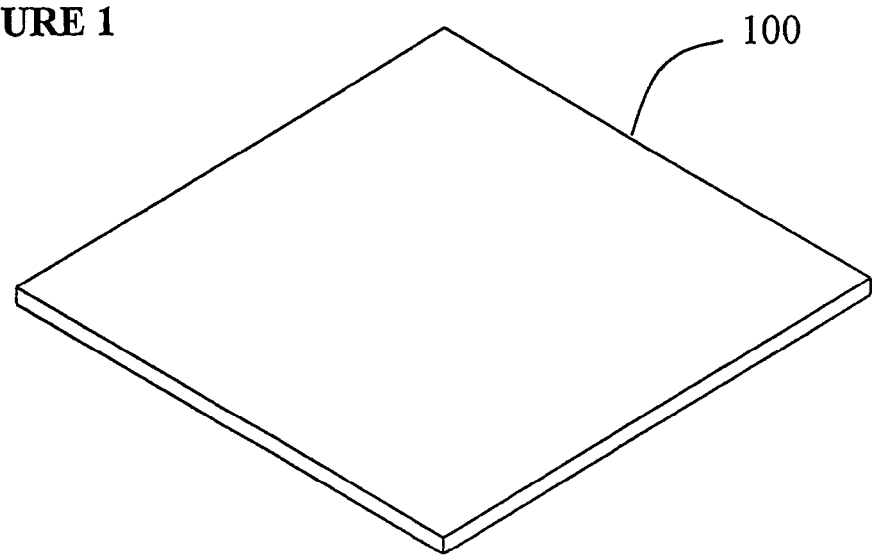
FIG. 1 shows a schematic three quarter view of a substrate for use in fabricating wafer assemblies.

Packaging Layer(s) Primarily Providing Mechanical Protection and Component Positioning Referring to FIG. 1, a substrate 100 suitable for use in integrating active and/or passive components and devices might comprise silicon (CTE=3 ppm), glass (CTE=8 ppm), composite materials, ceramics including multi-layer ceramics such as alumina (CTE=6 ppm), and low temperature-co-fired ceramics (LTTC), and even conventional printed circuit board materials such as polyimide (CTE=50 ppm) and FR-4 (CTE=16 ppm). The dimensions of the substrate 100 might vary considerably, for instance having dimensions of the order of less than one inch up to about twelve inches. In the following example, the substrate is a pre-fabricated, six-inch substrate.

Figure 2:
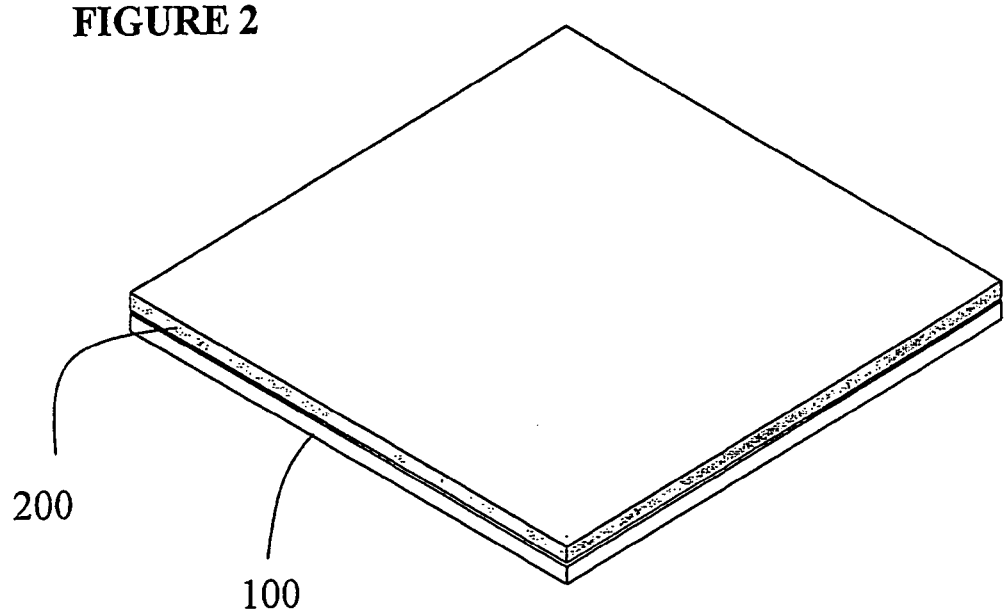
FIG. 2 shows the substrate of FIG. 1 with a packaging layer deposited on the substrate.

Referring to FIG. 2, a packaging layer 200 of hybrid glass material is applied to the whole substrate and pre-baked before patterning by exposure using ultra-violet (UV) light. The layer thickness may vary from 1 nm to 1 mm.

Example 1

In more detail, in a first method the packaging layer 200 of hybrid glass material [CTE approximately 35 ppm index of refraction of 1.51 at 1550 nm and dn/dT value of $-3.2 \times 10^{-4}$ (1/°C.)] is synthesized by applying wet chemistry processing techniques (ie synthesis using liquid phase conditions). In particular, 0.1 mol of 3-glysidoxy-propyl trimethoxysilane is mixed with 0.0125 mol of tetrachlorosilane in excess of diethyl chloride. The solution is refluxed and then 0.1 mol of 3-methacryloxy-propyl trimethoxysilane and 0.05 mol of tetrachlorosilane are added to the solution. In addition, excess of ultra pure water (typically where contamination is less than 10 ppb) is added and the mixture is allowed to react for several hours. Sodium hydrocarbonate is added into the solution after which the precipitate is filtered. The material is finalized by removing volatile components such as water and solvent from the solution and 0.5 w-% of benzophenone and 0.25 w-% of Irgacure 819 are added.

The following lists the purposes of each of the precursors mentioned above although it should be noted that they may be multi functional:

3-Glysidoxy-Propyl Trimethoxysilane is used to increase the CTE and produce flexibility in the matrix. The glysidoxy part of the molecule may also be used for thermal or photo polymerisation of the material. The trimethoxy part of the precursor undergoes a hydrolysis and condensation reaction and forms a silicon oxide matrix. It thus decreases the CTE but increases the thermal stability.

Tetrachlorosilane undergoes hydrolysis and condensation and contributes to a silicon dioxide matrix in the material system. It increases thermal stability and decreases CTE. It may also be used as a catalyst for the ring-opening polymerisation of the epoxy (e.g. glysidoxy) moieties in the material since it acts as a Lewis acid.

3-Methacryloxy Propyl Trimethoxysilane is used to create photosensitivity in the material. A methacryloxy moiety forms the photosensitivity through acryloxy carbon to carbon double bond breakage and continual crosslinking polymerisation. The organic polymer matrix formed increases the CTE and is not as stable as an inorganic silicon oxide matrix. The trimethoxy part undergoes hydrolysis and condensation and forms a silicon oxide matrix.

Water is used as a hydrolyzation agent for alkoxides and chlorates.

Sodium Hydrocarbonate is used to neutralize the material which contains some free chlorine ions. The carbonate reacts with free protons and thus neutralizes the solution.

Benzophenone is used as a thermal/photo initiator to form free radicals during thermal/photo exposure to create methacryloxy crosslinking.

Irgacure is used as a photoinitiator to form free radicals during photo exposure to activate methacryloxy crosslinking. Irgacure is a product of Ciba Specialty Chemicals.

The material is spun-on (or alternatively dip deposited) by applying a dynamic spinning procedure. Edge bead removal is carried out by using acetone spray. The sample is prebaked at 120° C. for 5 minutes on a hot plate in nitrogen.

Example 2

In a second method, the packaging layer 200 of hybrid glass material [CTE approximately 15 ppm, index of refraction of 1.50 at 1550 nm and dn/dT value of $-2.4 \times 10^{-4}$ (1/° C.)] is synthesized as follows. 0.1 mol of phenyltrichlorosilane, 0.1 of 3-methacryloxypropyl trichlorosilane and 0.016 mol of trimethylolpropane trimethacrylate are mixed and hydrolysed in the presence of dichloromethane and ultra pure water. The mixture is reacted for a time (from 1 hour to 48 hours) sufficient to allow all the silanes to hydrolyze. The organic solvent phase is separated from the solution. The material is finalized by removing volatile components such as water and solvent from the solution and 0.5 w-% of benzophenone and 0.25 w-% of Irgacure 819 and Irgacure 184 are added.

In this second method:

Phenyltrichlorosilane is used to increases the CTE from silicon dioxide values. The phenyl moiety is highly stable and also provides physical flexibility and elasticity in the resulting material. It hydrolyses and condenses to form a silicon oxide matrix.

3-methacryloxypropyltrichlorosilane is used to create photosensitivity in the material. A methacryloxy moiety forms the photosensitivity through acryloxy carbon to carbon double bond breakage and continual crosslinking polymerisation. The organic polymer matrix formed increases the CTE and is not as stable as an inorganic silicon oxide matrix. The trichloro part undergoes hydrolysis and condensation and forms a silicon oxide matrix.

Trimethylolpropane Trimethacrylate is used to increase the photosensitivity of the material during exposure. The three methacryloxy moieties in the molecule participate in the free radical polymerisation and result in a highly crosslinked organic matrix. The organic polymer matrix formed increases the CTE and is not as stable as an inorganic silicon oxide matrix.

Benzophenone is used as a thermal/photo initiator to form free radicals during thermal/optical exposure to create methacryloxy crosslinking.

Irgacure is used as a photoinitiator to form free radicals during photo exposure to activate methacryloxy crosslinking. Irgacure is a product of Ciba Specialty Chemicals.

The material is spun-on (or alternatively dip deposited) by applying a dynamic spinning procedure and edge bead removal is carried out by using acetone spray. The sample is prebaked at 120° C. for 10 minutes on a hot plate in nitrogen.

Example 3

In a third method, the packaging layer 200 of glass material [CTE approximately 22 ppm, index of refraction of 1.48 at 1550 nm and dn/dT value of $-1.8 \times 10^{-4}$ (1/° C.)] is synthesized as follows. 0.1 mol of phenyltrichlorosilane and 0.1 mol of trichlorovinylsilane are mixed and hydrolyzed in the presence of dichloromethane and ultra pure water. The mixture is reacted for a time (from 1 hour to 48 hours) sufficient to allow all the silanes to hydrolyze. The organic solvent phase is separated from the solution. The material is finalized by removing volatile components such as water and solvent from the solution and 0.5 w-% of benzophenone and 0.25 w-% of Irgacure 819 and Irgacure 184 are added.

In this third method:

Phenyltrichlorosilane is used to increases the CTE from silicon dioxide values. The phenyl moiety is highly stable and also provides flexibility for the resulting material. It hydrolyses and condenses to form a silicon oxide matrix.

Trichlorovinylsilane is used to create photosensitivity in the material. A vinyl moiety forms the photosensitivity through the carbon to carbon double bond breakage and continual crosslinking polymerisation.

The organic polymer matrix formed increases the CTE. The organic matrix is not as stable as an inorganic silicon oxide matrix. The trichloro part undergoes hydrolysis and condensation and forms a silicon oxide matrix.

Benzophenone is used as a thermal/photo initiator to form free radicals during thermal/photo exposure to create methacryloxy crosslinking.

Irgacure is used as a photoinitiator to form free radicals during photo exposure to activate methacryloxy crosslinking. Irgacure is a product of Ciba Specialty Chemicals.

The material is spun-on (or alternatively dip deposited) by applying a dynamic spinning procedure and edge bead removal is carried out by using acetone spray. The sample is prebaked this time at 150° C. for 5 minutes on a hot plate in nitrogen.

As mentioned earlier in this specification, if high processing temperatures are required the organic component content of the packaging layer 200 should be kept to a minimum. Low processing temperatures are made possible by using thermal or photo initiation of the organic matrix. In Examples 1 to 3 described above, three different hybrid glass material compositions and synthesis procedures are described that can be processed at various temperatures. Material synthesized according to Example 1 requires a processing temperature of not more than 200° C. Material synthesized according to Example 2 requires a processing temperature of not more than 150° C. Material synthesized according to Example 3 allows baking temperatures up to 450° C. or so. This can be particularly advantageous for example where a soldering operation is to be carried out since the materials may then be subjected to relatively high temperatures.

Figure 3:
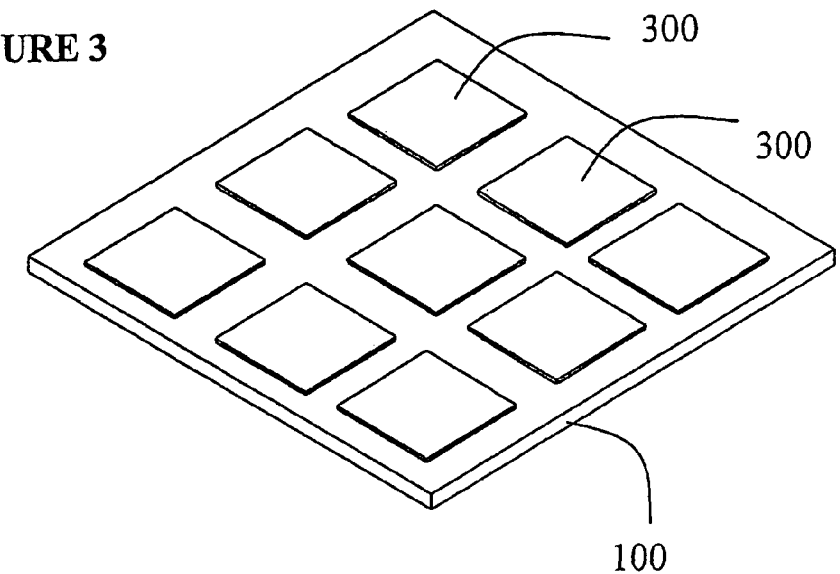
FIG. 3 shows the substrate of FIG. 2 after lithographic processing of the packaging layer to produce multiple patterned structures.

Referring to FIG. 3, the packaging layer 200 is patterned lithographically by exposing it to UV light and developing it with a chemical developer. The layer 200 may also be treated at elevated temperature to increase the density of the glass material. The result is a plurality of patterned structures 300 which contain features for use in integration that are shown in more detail in FIGS. 5 to 9.

In more detail, the packaging layer 200 is UV (I-line) exposed through a dark-field contact mask which contains both binary and gray-scale features. The packaging layer 200 is then spray developed with a mixed ethanol methyl isopropyl ketone developer. The material acts as a negative-tone photoresist. This part of the process is finalized by baking at 200° C. for 2 hours in nitrogen.

Gray scale lithography, for producing gray-scale features, is a known technique described for example in the following: "Fabrication of Micro-Optical Structures by Applying Negative-Tone Hybrid Glass Materials and Greyscale Lithography", by A. H. O. Käkkäinen, J. T. Rantala, M. R. Descour, published in Electronics Letters, Vol. 38, No. 1, pp 23-24 (2002).

The process just described can be used to produce a thick assembly structure (for instance in the range from 1 micron to 1 mm) by lithographic means. This structure might for instance have recesses or holes in which contact pads and optical and/or electrical components can be positioned in relation to one another and these are further described with reference to FIGS. 5 to 9.

Figure 4:
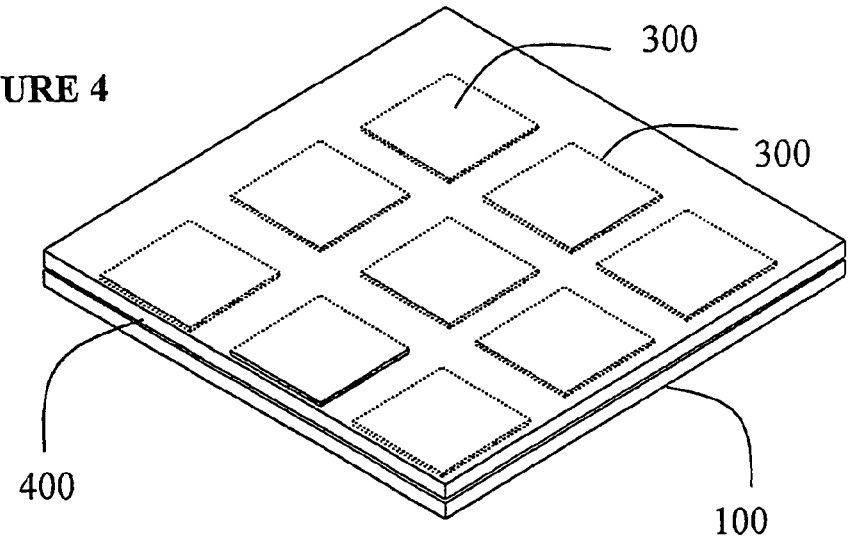
FIG. 4 shows the structure of FIG. 3 after addition of a spin-on glass layer above the patterned structures of the packaging layer.

Referring to FIG. 4, once the components and interconnect material are in place, in or on the packaging layer 200, an optional further packaging layer 400 can be deposited for further protection and strength, using a spin-on glass procedure followed by processing at low temperature at wafer level. This further packaging layer 400 can again be of hybrid glass but conventional polymers such as polyimides or epoxides can also be used. Typically, the further packaging layer 400 is made of a material which is an optically different mix from that of the earlier packaging layer 200 to produce a lower refractive index in the further packaging layer 400. This lower refractive index allows the further packaging layer 400 to provide optical confinement for instance of an evanescent field associated with optical radiation travelling in the assembly in use. The thickness of the further packaging layer 400 will usually be at least 1 micron but in any event preferably thick enough that optical and/or electrical components already mounted are buried by it.

(The patterned structures are shown in dotted outline in FIG. 4. However, this should not be taken to mean that the further packaging layer 400 is opaque in visible light. It may or may not be opaque in visible light.)

Figure 5:
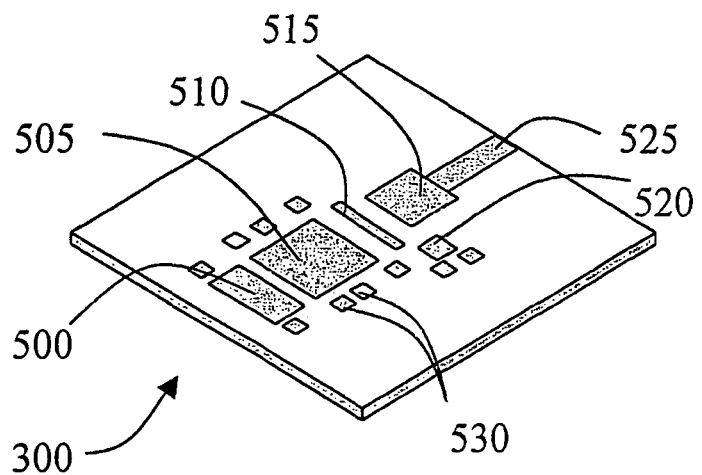
FIG. 5 shows one of the patterned structures of FIG. 3 in more detail.

Referring to FIG. 5, each one of the patterned structures 300 of FIG. 3 is a patterned hybrid glass structure that contains a set of recesses or holes, each one of which provides an integration location for a component or other element of an assembly. For example, each recess or hole as shown in FIG. 5 might be dimensioned and positioned to provide the following:

photodetector recess 500
gain element recess 505
tunable reflection element recess 510
optical isolator recess 515
thermo element or temperature sensor recess 520
fibre groove 525
integration or contact pads 530

An assembly with its components in place (see FIGS. 10A and 10B) might for example be used as a tunable optical source of the type described in U.S. patent application Ser. No. 10/046,914 assigned to Optitune plc. In such an optical source, a tunable element 1010, such as an electro-optically controlled zone plate device or a Fabry Perot element which can be moved using a micro-electromechanical system (MEMS), is used to return optical radiation of a selected wavelength to a tunable laser 1015. A photodiode 1020 can be used to monitor the laser performance and the output of the assembly can be picked up by a fibre 1000 located in the fibre groove 525.

Other ways of tuning an optical source that might be used in an embodiment of the present invention include a tunable thin film filter, a micro-prism, a prism-grating combination or a prism-grating-prism device.

As well as the directly functional parts of an assembly as described above, it is also possible to embed control electronics such as thermal controllers, based on for example a thermo element or temperature sensor 520 which is also locatable at a hole or recess in the packaging layer 200 of the glass material. This becomes available because of the very low processing temperatures, for instance less than 200° C., at which the hybrid glass material can be deposited. Hence the packaging layer 200 can be fabricated on top of metallic structures which typically have a melting point around 350° C. or more. Conventional glass manufacturing techniques cannot be used in such circumstances due to the fact that they typically require temperatures of more than 800° C. to consolidate.

Another significant advantage of the hybrid glass materials as a packaging material is that conventional glass materials cannot be directly lithographically patterned after deposition. The use of a hybrid glass material which has lithographic patterning capability removes a significant number of processing steps in manufacture.

Although described primarily as being located in the packaging layer 200 as described above, control electronics can alternatively be fabricated either into the substrate 100 or on top of the substrate 100. If they are located in the hybrid glass packaging material, that might be by use of holes or recesses as described above and/or by the use of a second hybrid glass material deposition. This is shown as a further layer 400 in FIG. 6.

The substrate 100 may also include optically active device such as taps (photodiodes), laser drivers and wavelength reference devices. They might be integrated inside the substrate or in layers deposited above the substrate.

Interconnect material is present in the packaging layer 200 as the integration or contact pads 530. Such interconnect material is of known type and configuration and might comprise for example copper (CTE 17 ppm) or aluminium (CTE 23 ppm). To make electrical connection, the integration or contact pads 530 can be provided on thin pads at the surface of the substrate 100 or integrated into a layer provided for the purpose. To make electrical connection between the contact pads 530 and components, wire bonds 1100 (shown in FIG. 11) can be used.

Figure 12:
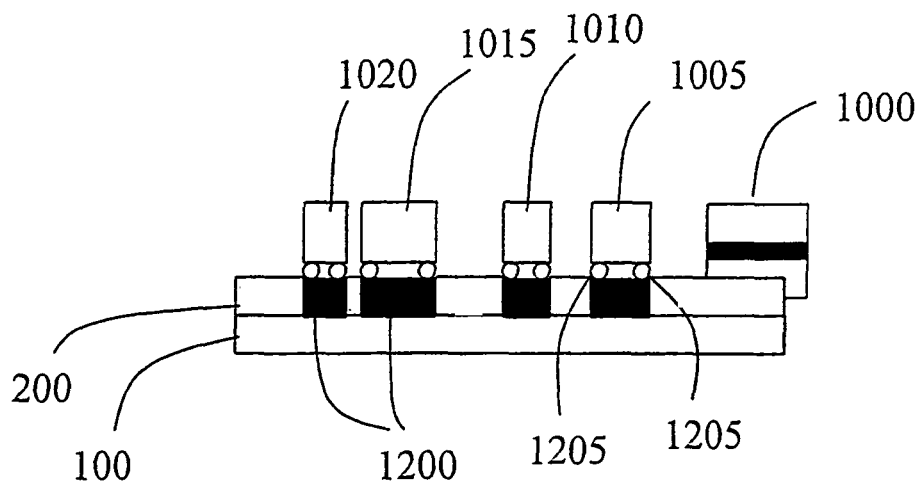
FIG. 12 shows the vertical cross section of FIG. 7 with the addition of a bump-bonded sub-assembly of components which the structure is intended to accommodate.

In an alternative arrangement, electrically interconnecting mounting pads 1200 can be positioned in the component recesses 500, 505, 510, 515, 520 and the known technique of "solder bump bonding" can be used. This is shown in FIG. 12.

In general, fabrication and connection of the mounting or contact pads 530, 1030 is further discussed below with reference to FIGS. 13 to 15.

After creation of the patterned hybrid glass packaging layer 200 with its mounting or contact pads 530, 1030, the layer(s) can be "back" polished using a chemical and/or mechanical polishing technique. Electrical and/or optical components can then be mounted to create a wafer assembly. Such components might include for example a gain element, photodetector, reflecting element, lenses (ball or graded index type), optical isolator, and a thermo-element.

Figure 6:
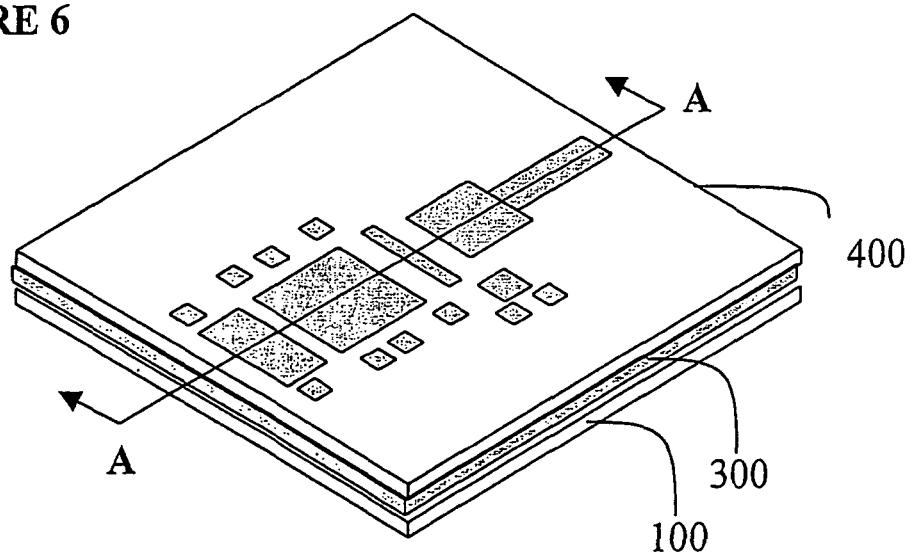
FIG. 6 shows the patterned structure of FIG. 5 with the supporting substrate and the spin-on glass layer.
Figure 7:
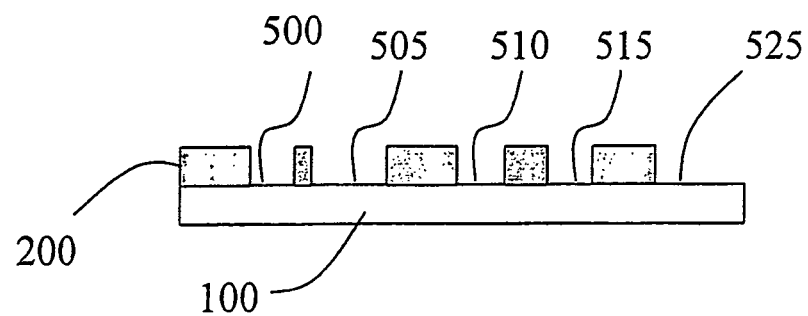
FIG. 7 shows a vertical cross section through the patterned structure and supporting substrate of FIG. 6, generally along the optical axis of the sub-assembly which the structure is intended to accommodate.

Referring to FIG. 7, a cross section long the line "A-A" in FIG. 6, viewed in the direction indicated by the arrows, shows lithographically defined holes in the packaging layer 200 for the following:

photodetector hole 500
gain element hole 505
tunable reflection element hole 510
optical isolator hole 515

The fibre V-groove 525 is also shown. Such a groove can be fabricated using known gray scale lithography techniques. Although shown in FIG. 7 as a hole, the depth of the groove will of course be tailored to the dimensions of the fibre end to be located therein and might be for instance of the order of 50 µm deep.

Referring to FIGS. 8 and 9, the patterned packaging layer may be provided with a "closed" integration structure, as shown in FIG. 8, or an "open" integration structure, as shown in FIG. 9. That is, the holes or recesses for the various components might be designed as physically discrete and separate features in the packaging layer 200 or they may be interconnected.

A primary difference between the closed and open structures in practice is the presence or absence of the packaging layer 200 in the optical transmission path through the components. In the closed structure, if the packaging layer 200 is deep enough, it will lie in at least part of the optical transmission path between the components. This can be understood particularly with reference to FIGS. 10A and 10B which show components 1020, 1015, 1010, 1005 located in appropriate holes in the packaging layer 200. In FIG. 10A, the components are all aligned along a common optical axis 1025 but the optical axis lies above the packaging layer 200 and the optical transmission path of the assembly does not pass through any part of the packaging layer 200. In a closed structure as shown in FIG. 8, if the packaging layer 200 were deeper relative to the components, the common optical axis 1025 would pass through it. This has implications for the choice of packaging layer material since optical properties such as transparency and refractive index could become important. Such a configuration is shown in FIG. 10B.

Referring to FIG. 10A, this shows a cross section similar to that of FIG. 7 but with components located to their appropriate holes in the packaging layer 200. In particular, the following components can be seen located:

photodetector 1020
gain element 1015
tunable reflection element 1010
optical isolator 1005
single mode optical fibre 1000

These components 1000, 1005, 1010, 1015, 1020 are mounted on integration pads 1030 and aligned along a common optical axis 1025 which lies above the packaging layer 200. The packaging layer 200 might thus be deposited as a closed structure regardless of its optical characteristics, as shown in FIG. 8, although it may have for example guiding or absorption characteristics which need to be taken into account in use. The closed structure has an advantage in providing improved protection to the substrate in comparison with an open structure as shown in FIG. 9. The packaging layer 200 can provide at least coarse alignment of the optical components as well as mechanical protection.

The integration pads 1030 are constructed from any suitable material which will adhere to the components and other materials it will be in contact with. The pads 1030 may or may not be electrically conductive, as required.

In FIG. 10A, both a gain element 1015 and a separate tunable reflection element 1010 are shown. These can be used together to provide a tunable optical source. The gain element 1015 might be an external cavity, single mode semiconductor laser whose output can be tuned by tuning the feedback from an external cavity created by the tunable reflection element 1010. For example, the tunable reflection element 1010 might comprise a diffraction device arranged in a Littrow configuration, the diffraction device comprising a thermo-optic material which can be thermally controlled for tuning.

In practice, the tunable reflection element 1010 might be replaced or supplemented by the use of an external optical modulator such as an amplitude, frequency and/or intensity modulator. More specifically, for example, an external modulator might be a Mach-Zehnder modulator, a semiconductor multiple quantum well modulator or an electrorefraction modulator.

Referring to FIG. 10B, the gain element 1015 and separate tunable reflection element 1010 might be replaced by a monolithic tunable source 1035 such as that disclosed in U.S. Pat. No. 6,041,071 in the name Coretek Inc, or that disclosed in U.S. Pat. No. 6,275,317 in the name Agere Systems Optoelectronics Guardian Corp. Another example of an integrated form of tunable source 1035 is disclosed in copending U.S. patent application Ser. No. 10/046,914 assigned to Optitune PLC.

Figure 11:
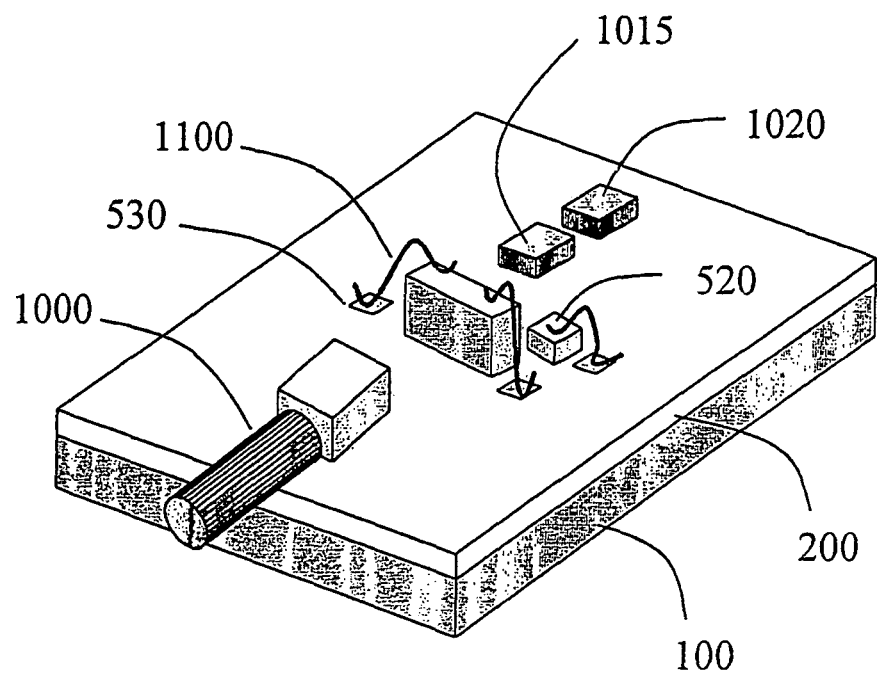
FIG. 11 shows a three quarter view from above of the wire-bonded sub-assembly shown in FIGS. 10A and 10B in place in the wafer sub-assembly.

Referring to FIG. 11, metallic interconnect pads 530 are also positioned in holes in the packaging layer 200. These contact pads 530 may be made of metals known to be suitable for bonding using wire bonding. Electrical connection to the components 1000, 1005, 1010, 1015 can then be provided as necessary using wire bonds 1100.

The components 1000, 1005, 1010, 1015 can largely be mounted and the wire bonds 1100 put in place before a wafer assembly is diced into individual assemblies. It is only generally possible to mount the fibre 1000 to its groove after dicing however.

Referring to FIG. 12, instead of using wire bonds 1100 the components 1000, 1005, 1010, 1015 can be mounted using the known technique of "solder bump bonding". In this technique, electrical interconnection is provided by mounting pads 1200 in the holes in the packaging layer 200 under the components. The components 1000, 1005, 1010, 1015 are provided with solder bumps 1205 on their bonding surface and these solder bumps 1205 are brought into contact with the interconnecting mounting pads 1200 and heated to form a bond between the component and the mounting pad 1200. After the heat treatment, the solder bumps are spread into intimate contact with the components 1000, 1005, 1010, 1015 and the mounting pads 1200 and can provide particularly good electrical performance.

There are variations in solder bump bonding which can also be used in an embodiment of the present invention. For example the solder bumps 1205 can be provided on interconnect material in the mounting pads 1200 instead of or as well as on a bonding surface of the components. In "double bump bonding", two layers of bumps are provided, one on top of the other.

The electrical contact pads 530 and interconnecting mounting pads 1200 can be fabricated by post-processing of the substrate 100 and packaging layer 200 and this is further discussed below with reference to FIGS. 13 to 15.

The use of bump bonding provides thermo-mechanical as well as environmental protection for interconnects in the sub assembly layer. Optical components attached using the bumps are protected from shear stresses. Furthermore, this technique eliminates use of an underfill process which might otherwise be necessary for die or component attachment, which makes the processing procedures less complicated.

In practice, the use of the solder bumps 1205 and mounting pads 1200 also makes it possible to tune the positioning of optical components even after they are bonded to electrical interconnect material. The bonding material can be slightly heated so that it softens to accommodate movement of the components, for instance on a hot chuck or by using a laser or the like. Movements of a few hundred nanometers are possible in lateral positioning and movements of a few tens of nanometers are easily achievable in vertical position tuning without causing high stresses in the component structures.

Figure 13:
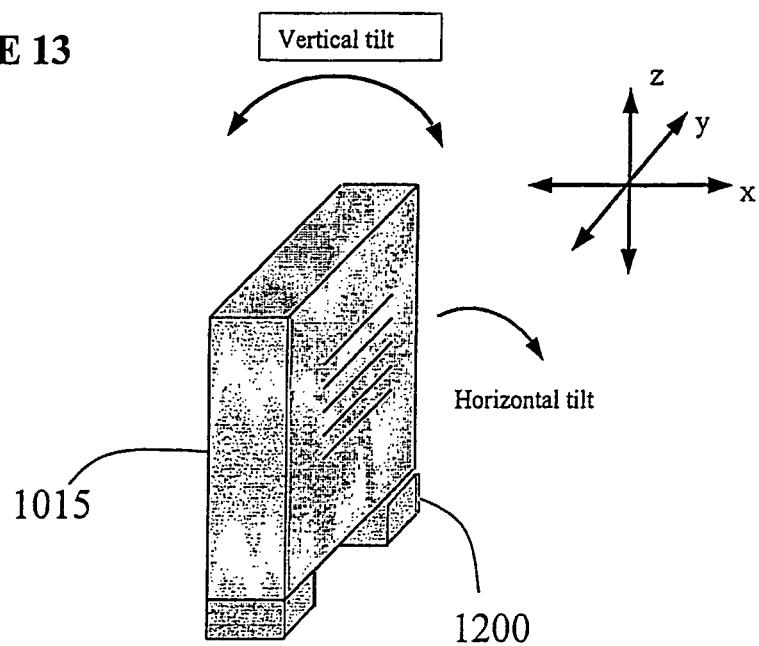
FIG. 13 indicates degrees of freedom in micromanipulation for alignment of optical components during fabrication of a wafer sub-assembly.

Referring to FIG. 13, an optical component such as a gain element 1015 can be mounted on a pair of contact pads 1200 by means of bump bonding. It can then be manipulated about vertical and/or horizontal planes by the use of for example a piezo or stepper motor controlled, nano-positioning stage "push" device while the solder material between the component 1015 and the contact pad 1200 is softened by the use of heat.

Figure 14:
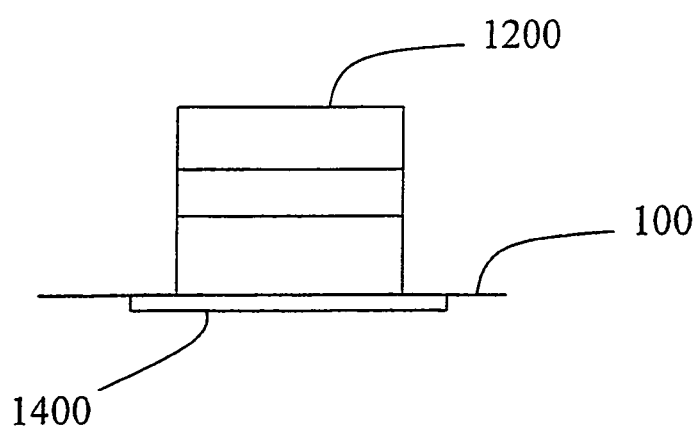
FIG. 14 shows a contact pad in cross section, for use in a bump-bonded sub-assembly as shown in FIG. 12.

Referring to FIG. 14, in more detail, each contact pad 1200 might be put down onto a thin film pad 1400 of a material such as solder which has been provided on or in the substrate 100. The contact pad 1200 can for example be evaporated or grown electrolytically through a window in a photoresist mask. Its dimensions might be for example 5 μm×5 μm in cross section with a depth in the range 0.5 to 100 μm, depending on the required position of the component to be mounted on it. The material of the contact pad might be for example a metal such as aluminium, gold, tin, molybdenum, nickel, platinum or copper but it may contain more than one layer and more than one material. The contact pad 1200 of FIG. 14 shows three layers.

Figure 15:
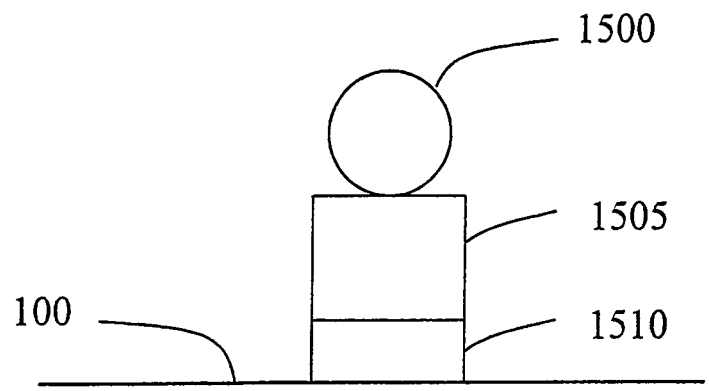
FIG. 15 shows a joining structure for a fibre pigtail in cross section, for use in a bump-bonded sub-assembly as shown in FIG. 12.

Referring to FIG. 15, another type of structure which might require to be mounted is a joining structure 1505 for a fibre pigtail (not shown). This might comprise the joining structure, mounted on a pad 1510 supported by the substrate 100. The joining structure at the same time supports a ball lens 1500. The fibre pigtail can then be mounted to abut the joining structure 1505 such that its optical axis is aligned with the lens 1500.

Optically Active Packaging Layers

Referring to FIGS. 16 to 21, a packaging layer in an embodiment of the invention can do considerably more than provide mechanical protection and alignment. These figures illustrate steps in fabricating an arrangement in which the packaging layers also provide optical properties in a finished assembly.

The materials used in providing optical properties can be of the same general type as described above, for example with reference to FIGS. 2, 3 and 4, and detailed examples are not therefore described below. However, clearly it is necessary to use materials having appropriate optical characteristics and these can be achieved as already discussed above.

Figure 16:
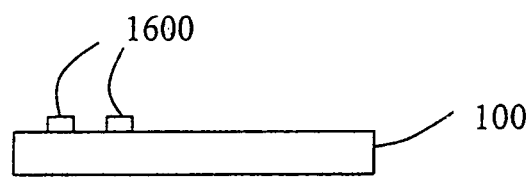
FIG. 16 shows a vertical cross section of a substrate supporting an electrical interconnect structure.

Referring to FIG. 16, a first step in fabrication of an assembly is to deposit an electrical interconnect structure 1600 on a substrate 100. This might have a thickness of for instance 1 μm.

Figure 17:
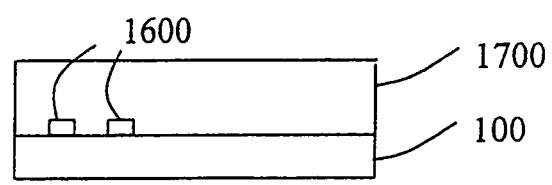
FIG. 17 shows the arrangement of FIG. 16 after application of a planarisation layer.

Referring to FIG. 17, a planarisation layer 1700 is deposited, covering the interconnect structure 1600. Planarisation can be achieved at 90%, 95% or even 99%, providing a uniform surface for subsequent lithography steps, using a layer which is 5 μm thick.

Figure 18:
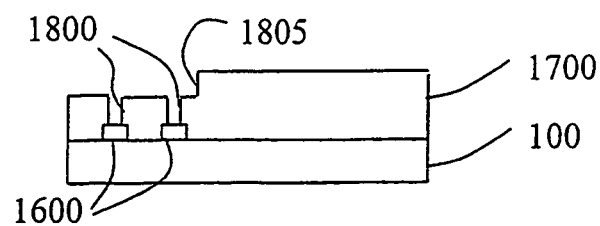
FIG. 18 shows the planarisation layer of FIG. 17 after photolithography and development or etching.

Referring to FIG. 18, the planarisation layer 1700 can be patterned lithographically. Using a lithographic mask having areas of different optical densities, firstly a step 1805 is created in the depth of the planarisation layer 1700 and secondly holes 1800 are created in the thinner portion of the planarisation layer 1700, exposing the interconnect structure 1600.

The patterning can be done either by using just a single lithography step, grayscale photomask and negative or positive tone material or by using a separate, subsequent photoresist layer(s) and carrying out the patterning by using etching of the layer 1700 to a desired shape. The step 1805 effectively now divides the overall assembly into two portions: a first, thinner portion having the interconnect structure 1600 and a second, thicker portion without.

FIG. 18 represents just one example of how the patterning and exposing the interconnect structures 1600 can be done. The interconnect structures 1600 can alternatively be exposed in their full width if it is preferably for the following fabrication steps such as bump bonding.

Figure 19:
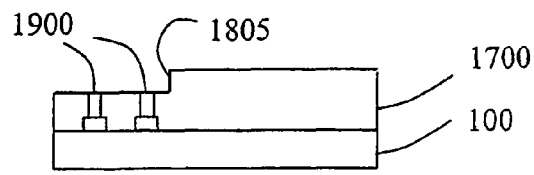
FIG. 19 shows the arrangement of FIG. 18 with electrical connections added to reach the electrical interconnect structure.

Referring to FIG. 19, the holes 1800 are filled with an electrically conductive material 1900 to enable electrical connection of a device mounted on the first portion of the assembly.

Figure 20:
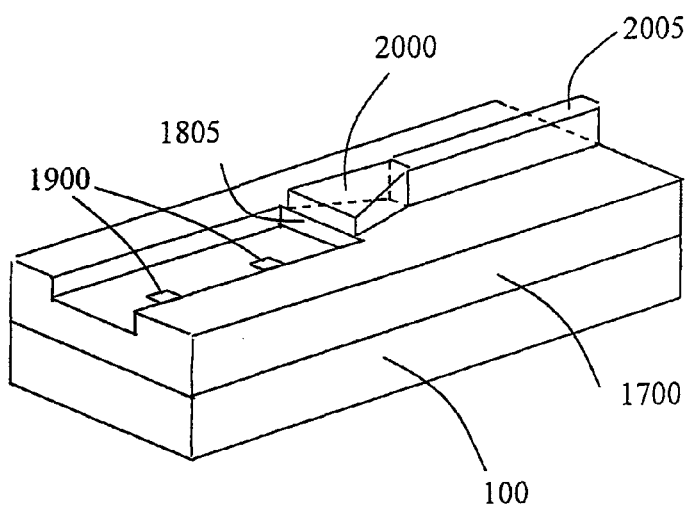
FIG. 20 shows a three quarter view from above of the arrangement of FIG. 19, with the addition of a tapered waveguide.

Referring to FIG. 20, it can be seen that the step 1805 does not in fact extend right across the assembly but provides an end to a rectangular depression in the planarisation layer 1700, over the interconnect structure 1600. A waveguide structure 2000, 2005 is now constructed.

Although other arrangements might be suitable in other assemblies, in the arrangement shown in FIGS. 6 to 21, a semiconductor laser 2100, 2105 is to be mounted in the rectangular depression and the waveguide structure 2000, 2005 provides a specialised coupling arrangement to deliver optical radiation from the laser output facet to another component In particular, the purpose of the waveguide structure 2000, 2005 is to change the dimensions of the laser beam's optical mode cross section, in adiabatic fashion, prior to delivery to the other component. The waveguide structure 2000, 2005 therefore has a mode taper section 2000 and a cylindrical waveguiding section 2005 having a square or rectangular cross section. (Tapered structures of this sort are known for mode-size matching, for instance in both laser sources and passive waveguide devices, and the specific design characteristics of the waveguide structure 2000, 2005 are not therefore further discussed herein.)

The waveguide structure 2000, 2005 is fabricated using techniques which can control both depth and the dimensions parallel to the supporting surface of the substrate 100. Firstly the material of the waveguide structure 2000, 2005 is spun onto the assembly, then etched using a lithographic mask with both binary and gray-scale features. The gray-scale features will produce the gradual change in depth along the mode taper section 2000 while the binary features will produce the shape of the waveguide structure 2000, 2005 in plan view.

In an alternative approach to producing the planarisation layer 1700 and the waveguide structure 2000, 2005, the materials for both can be spun in turn onto the substrate 100 and then etched using a mask having a combination of binary and gray-scale features to achieve the desired construction.

Figure 21:
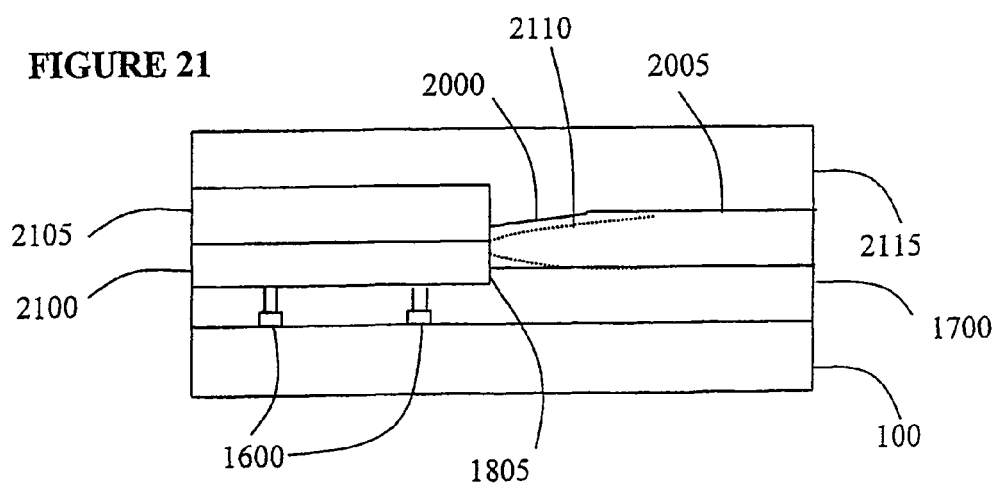
FIG. 21 shows a vertical cross section through the arrangement of FIG. 20, together with a flip chip mounted optical device coupled to the waveguide and a further packaging layer.

Referring to FIG. 21, this shows a vertical cross section along the optical axis of a completed assembly. Here, a semiconductor laser having optical layers 2100 supported by a substrate 2105 has been flip-chip mounted into the rectangular depression in the planarisation layer 1700, over the interconnect structure 1600. A facet of the laser 2100, 2105 abuts the step 1805 in the planarisation layer 1700 and, in use, an output beam 2110 is delivered to the waveguide structure 2000, 2005. The laser 2100, 2105 can be driven electrically through the interconnect structure 1600. Lastly, a further packaging layer 2115 has been applied across the assembly.

Flip chip mounting is a known technique in which a device or assembly which has been fabricated on a substrate is then inverted and mounted onto another substrate for connection to other devices or components. The result is that the device or assembly is sandwiched between its own substrate and the substrate carrying the other components. A technique of this general sort is disclosed in U.S. Pat. No. 5,478,778, and in co-pending British patent application GB 225,522.2, in the name Optitune plc.

Where the device or assembly is optical, this can have advantages in ease of optical alignment. The basic principle is that the optical confinement regions for the first and second components can be very accurately matched during fabrication to achieve accurate optical coupling of the two when inverted in the substrate based assembly. The thickness of the respective substrates for the first and second components, which is far less controllable, is not relevant in the alignment which is determined instead by the thickness of confining layers constructed during fabrication. One of the components may alternatively be fabricated on the substrate based assembly using planar fabrication techiques prior to assembly of the other. The distances from the bonding surfaces to the optical confinement regions for the first and second components are matched and flip chip mounting produces passive alignment in the direction normal to the bonding surfaces. Alignment in the other two directions, in a plane parallel to the bonding surfaces, can be achieved using known alignment techniques.

Specific optical characteristics of the materials selected for an assembly as described above and shown in FIG. 21 are not described here. Clearly, the refractive index of layers such as the waveguide structure 2000, 2005 and the packaging layers 1700, 2115 above and below it would have to be selected so that waveguiding is achieved. However, waveguides and factors in their design are known and widely documented.

It will be understood that many variations and changes can be made in assemblies made according to an embodiment of the invention. A minor change might be to use different techniques for lithography and etching. However, in general, techniques including those described above can be used in producing a wide variety of wafer-based assemblies. For example, a substrate based assembly can be used to fabricate and assemble:

various light source elements such as laser diodes and fibres which need to be coupled to elements or components external to the substrate based assembly
light emitting diodes (organic and inorganic)
free space optics components such as lenses, beam splitters, prisms, gratings, and the like
detectors such as charge coupled devices and CMOS devices It might be noted that a substrate based assembly might be much more complex than as shown in the Figures. For example, in FIG. 21, the laser 2100, 2105 is shown with its rear facet adjacent the edge of the substrate 100. This is not essential. There may be components mounted on the substrate 100 behind the laser for monitoring or other purposes. The packaging layers 1700, 2005 and 2115 might be used to provide waveguiding behind the laser as well as in front.

Any of these components can potentially be fabricated first on a separate substrate and then assembled into the substrate based assembly of the invention.

A further function available in using the hybrid glass materials as packaging layers is as index matching material, including fluids, for use in assembling and aligning the confinement regions of optical components. The refractive index of the hybrid glass materials used should preferably be lower than the index of the optical confining material (e.g. waveguide core) and higher than air. This can be optimized in each case. The index matching material can also be made photocurable and serve at the same time as an additional bonding layer of the two optical components. The two optical components can be first aligned together and then the UV-curable index matching fluid is applied and cured using Uv-light (and/or heat).

What is claimed is:

1. A substrate-based assembly for carrying optical components, the assembly comprising:
   a substrate;
   at least one active optical component and at least one passive optical component mounted on the substrate;
   a packaging layer formed on the substrate for protecting said optical components, the optical components and the packaging layer being carried by the substrate;
   wherein the packaging layer comprises at least two packaging layers, each of said packaging layers being at least one of (a) a planarization layer or (b) a passivation layer, at least one of the packaging layers comprising a hybrid glass material having both organic and inorganic components and being provided with a plurality of recesses,
   wherein each of the recesses has a wall surface therewithin supporting at least one of the optical components, each recess having a perimeter which is substantially closed, into which at least one of the components is mounted; and
   wherein the refractive index of a first of the at least two packaging layers is different from the refractive index of either a second of the at least two packaging layers or at least one of the optical components.

2. The substrate-based assembly according to claim 1, wherein the hybrid glass material includes an organic component which polymerizes by cross-linking.

3. The substrate-based assembly according to claim 1, wherein the hybrid glass material includes an organic component which polymerizes under thermal or photo treatment.

4. The substrate-based assembly according to claim 1, wherein the hybrid glass material includes at least one of an epoxy component, aluminium oxide and silicon oxide.

5. The substrate-based assembly according to claim 1, wherein the hybrid glass material comprises an inorganic matrix provided at least in part by a metal alkoxide or salt, the metal alkoxide or salt each being hydrolyzed in provision of the inorganic matrix.

6. The substrate-based assembly according to claim 5 wherein the metal alkoxide or salt is based on groups 3A, 3B, 4B and/or 5B of the Periodic Table.

7. The substrate-based assembly according to claim 1, wherein the hybrid glass material includes at least one hydrocarbon compound from the group comprising acrylates, epoxides, alkyls, alkenes, and aromatic groups.

8. The substrate-based assembly according to claim 1 wherein the coefficient of thermal expansion of the at least one packaging layer approaches that of the substrate material.

9. The substrate-based assembly according to claim 1, wherein the at least one recess contains electrical interconnect material for providing electrical connection to at least one component packaged by the packaging layer.

10. The substrate-based assembly according to claim 9 wherein the coefficient of thermal expansion of the at least one packaging layer approaches that of the electrical interconnect material.

11. The substrate-based assembly according to claim 9 wherein the coefficient of thermal expansion of the at least one packaging layer differs from the coefficient of thermal expansion of the electrical interconnect material and/or the substrate material by not more than 15 parts per million.

12. The substrate-based assembly according to claim 9 which further comprises at least one contact pad for a wire bond to the at least one component, the electrical interconnect material being present in said contact pad or wire bond.

13. The substrate-based assembly according to claim 9 which further comprises at least one mounting pad for mounting the at least one component, the electrical interconnect material being present in said mounting pad.

14. The substrate-based assembly according to claim 1, wherein said at least one optical component comprises a bump bonded optical component.

15. The substrate-based assembly according to claim 1 wherein the material of the at least one packaging layer is lithographically patterned.

16. The substrate-based assembly according to claim 15 wherein the material of the at least one packaging layer comprises at least one organic material which photopolymerizes, the at least one organic material being selected from the group comprising acrylates, epoxides, alkyls, alkenes, and aromatic groups.

17. The substrate-based assembly according to claim 1 wherein the packaging material has a processing temperature of not more than 450° C.

18. The substrate-based assembly according to claim 1 wherein the packaging material has a processing temperature of not more than 200° C.

19. The substrate-based assembly according to claim 1 wherein the packaging material has a processing temperature of not more than 150° C.

20. The substrate-based assembly according to claim 17 wherein the packaging material is fabricated from a material comprising a polymerisation initiator.

21. The substrate-based assembly according to claim 1 having a substrate comprising at least one material from the group comprising silicon, glass, composite materials, ceramics and printed circuit board.

22. The substrate-based assembly according to claim 1 wherein the at least one packaging layer is a planarization layer.

23. The substrate-based assembly according to claim 22 wherein the planarization layer provides waveguiding.

24. The substrate-based assembly according to claim 1 wherein at least one of the recesses comprises an aperture to give access to an electrical interconnect structure.

25. The substrate-based assembly according to claim 22 wherein one or more components is/are mounted at least partially on the planarization layer.

26. The substrate-based assembly according to claim 1 wherein the refractive index of a first of the at least two packaging layers is different from the refractive index of a second of the at least two packaging layers.

27. The substrate-based assembly according to claim 1 wherein the at least one packaging layer transmits optical radiation.

28. The substrate-based assembly according to claim 1 wherein the packaging layer provides an alignment feature for use in aligning an optical component in the assembly.

29. The substrate-based assembly according to claim 1 wherein the packaging layer, provides refractive index matching in use of the assembly.

30. The substrate-based assembly according to claim 1 wherein the packaging layer, provides bonding between optical components in the assembly.

31. The substrate-based assembly according to claim 1 wherein the active optical component comprises a laser or a tunable optical source.

32. The substrate-based assembly according to claim 1 wherein at least one of the recesses comprises an aperture to give access to an electrical interconnect structure and wherein the active optical component is bump-bonded or flip-chip mounted in the assembly to connect to the electrical interconnect structure.

33. The substrate-based assembly according to claim 32, wherein the active optical component comprises a laser or a tunable optical source, the assembly further comprising an optical modulator, external to the laser or tunable optical source.

34. The substrate-based assembly according to claim 1 wherein the substrate-based assembly comprises a thick substrate-based assembly.

35. The substrate-based assembly according to claim 1 wherein the substrate-based assembly has a thickness in the range from 1 micron to 1 millimetre.

36. Opto-electronic equipment comprising the substrate-based assembly according to claim 1.

37. The substrate-based assembly as in claim 1, wherein the packaging layer provided with said one or more recesses is otherwise substantially continuous.

* * * * *